(12) United States Patent
Chen

(10) Patent No.: US 7,778,101 B2
(45) Date of Patent: Aug. 17, 2010

(54) MEMORY MODULE AND METHOD OF PERFORMING THE SAME

(75) Inventor: Ju-peng Chen, Taipei (TW)

(73) Assignee: Genesys Logic, Inc., Shindian (TW)

( * ) Notice: Subject to any disclaimer, the term of this patent is extended or adjusted under 35 U.S.C. 154(b) by 103 days.

(21) Appl. No.: 12/205,501

(22) Filed: Sep. 5, 2008

(65) Prior Publication Data
US 2010/0061133 A1 Mar. 11, 2010

(51) Int. Cl.
*G11C 7/00* (2006.01)
(52) U.S. Cl. ...................... 365/228; 365/226
(58) Field of Classification Search .............. 365/228, 365/226, 185.17, 149; 711/103, 105, 115
See application file for complete search history.

(56) References Cited

U.S. PATENT DOCUMENTS 5,550,781 A * 8/1996 Sugawara et al. .......... 365/222

2009/0089484 A1 * 4/2009 Chu ...................... 711/103

* cited by examiner

*Primary Examiner*—Vu A Le
(74) *Attorney, Agent, or Firm*—Kirton & McConkie; Evan R. Witt

(57) ABSTRACT

A memory module and a method of performing the same for access of an external electronic device are provided herein. The memory module includes a NAND-type flash memory, a dynamic random access memory (DRAM) unit, and a memory controller. The dynamic random access memory unit which is electrically connected to the NAND-type flash memory includes a dynamic random access memory and an internal power. The memory controller is used for controlling at least one of both the NAND-type flash memory and the dynamic random access memory unit. When the memory module is disconnected with the external electronic device, the internal power of the dynamic random access memory unit powers the dynamic random access memory, actively. Accordingly, data stored in the dynamic random access memory will be retained.

15 Claims, 3 Drawing Sheets

MEMORY MODULE AND METHOD OF PERFORMING THE SAME

TECHNICAL FIELD OF THE INVENTION

The present invention relates to a memory module, and more particularly to a memory module which treats a dynamic random access memory with an internal power as a data cache and a data buffer of a NAND-type flash.

BACKGROUND OF THE INVENTION

Commonly, memory for computer applications could be classified into a non-volatile memory type and a volatile memory type. A recognizable difference between both of the memory types is that the data stored in the non-volatile memory does not disappear with absence of power but the data stored in the volatile memory disappears with absence of power.

Random access memory (RAM) belongs to the volatile memory type and features on rapid accessing speed and disappearance of data stored in random access memory with absence of power, i.e. turn off of the host. Random access memory could be further classified into static random access memory (SRAM) and dynamic random access memory (DRAM). Due to a capability of rapid accessing speed, static random access memory is often applied for the demands on high speed reading and writing. Differently, dynamic random access memory is characterized in high density capacity, and therefore brings lower cost than static random access memory.

Early non-volatile memory includes a read only memory (ROM) which is allowed only for data read. As long as a data was written in read only memory, the data can not be changed. Programmable read only memory (PROM) belongs to the non-volatile memory type and includes a lot of fuses to burn after required programs or data load in. Erasable programmable read only memory (EPROM) belongs to the non-volatile memory type and can be utilized, repeatedly. For data writing, the erasable programmable read only memory is written in by a higher voltage. For data erasing, circuits disposed within a transparent window of the erasable programmable read only memory is exposed to ultraviolet. Electrically erasable programmable read only memory is similar to the erasable programmable read only memory, however, a difference therebetween is that electrically erasable programmable read only memory is erased by a higher voltage instead of ultraviolet.

Flash memory is the most popular non-volatile memory, currently. Flash memory is a type of memory which uses a block to be a unit to erase at a time. The time of erasing written data in each block of flash memory is faster than that of electrically erasable programmable read only memory which uses one byte to be a unit to erase at a time. Furthermore, flash memory could be classified into a NOR-type flash memory and a NAND-type flash memory. In comparison between both types of flash memory, erased time and written time of NOR-type flash memory are slower but provides a complete addressing and a data bus for allowing random access. Thus, it is proper to replace early read only memory such as a basic input/output system (BIOS) of a computer. In contrast, erased time and written time of NAND-type flash memory are faster but architecture of NAND-type flash memory does not possess a complete addressing and a data bus. NAND-type flash memory must be accessed in a block at a time and its erasable times are far larger than those of NOR-type flash memory. Accordingly, NAND-type flash memory is suitable as storage devices such as Smart Media (SM), Secure Digital (SD) card, Multimedia Card (MMC) and so on.

NAND-type flash memory consists of a plurality of blocks. Each block consists of a plurality of pages each having the same capacity size. In other words, capacity size of one block is larger than capacity size of one page. Characteristics of NAND-type flash memory are that erased capacity size must be one block at a time while reading capacity size and writing capacity size must be one page at a time.

With progress of semiconductor fabrication, capacity size of each page in NAND-type flash memory is developed increasingly larger. A common file management system requires a flash translation layer (FTL) to access NAND-type flash memory. The flash translation layer performs a translation between a logical address requested by the common file management system and a physical address of NAND-type flash memory. As mentioned above, erased capacity size must be one block while writing capacity size must be one page. Accordingly, if valid data occupies a page or pages within a block which is ready to be erased, it needs to be removed to another block firstly. Then, the block just can be erased. When a lot of such a small size data is written in NAND-type flash memory, efficiency of address translation in the flash translation layer is lowered easily therefore. In addition, if capacity size of written data is less than one page, the written data still occupies one page. This makes difference of the actual capacity size of the written data from the capacity size of the written data required by the system and thereby wastes memory space. This is so-called write amplification. On the contrary, the valid data within the block must be removed before erased but NAND-type flash memory is configured with limited erasable times. Over erasing times would lower lifetime of NAND-type flash memory.

FIG. 1 shows a conventional memory module 100 which utilizes a dynamic random access memory 102 to be as a data cache of a NAND-type flash memory 104. When an external electronic device 106 such as a computer or a mobile phone is electrically connected to the memory module 100, the external electronic device 106 supplies a power source 108 to the dynamic random access memory 102 and accesses the memory module 100 via a data transmission interface 110. When the memory module 100 is electrically disconnected with the external electronic device 106, the data stored in the NAND-type flash memory 104 is still retained but other data stored in the dynamic random access memory 102 is lost in following absence of the power source 108.

Consequently, there is a need to develop a solution to resolve the above-mentioned problem.

SUMMARY OF THE INVENTION

To resolve the problem, a primary objective of the present invention is to provide a memory module for access of an external electronic device. The memory module comprises a NAND-type flash memory, a dynamic random access memory unit, and a memory controller. The dynamic random access memory unit is electrically connected to the NAND-type flash memory and has a dynamic access memory and an internal power source electrically connected to the dynamic random access memory. When the memory module is disconnected with the external electronic device, the internal power source is switched to supply power to the dynamic random access memory, actively. Accordingly, the data stored in the dynamic random access memory can be retained. The memory controller is used for controlling at least one of both the NAND-type flash memory and the dynamic random access memory unit.

Another objective of the present invention is to provide a memory module for access of an external electronic device. The memory module comprises a data transmission interface, a dynamic random access memory unit, a NAND-type flash memory, and a memory controller. The dynamic random access memory unit is connected to the external electronic device via the data transmission interface and functions as buffer or cache of the data which is transmitted between the external electronic device and the memory module. The NAND-type flash memory is used for access of the external electronic device. The memory controller includes a data flow controlling unit for determining a specific amount of data transmitted between the NAND-type flash memory and the dynamic random access memory unit.

Another objective of the present invention is to provide a method of performing a memory module for access of an external electronic device, and the memory module comprises a dynamic random access memory unit, a NAND-type flash memory, and a memory controller. The method comprises the following steps of: by the dynamic random access memory unit with a data cache and a data buffer function, the external electronic device accessing the NAND-type flash memory; and utilizing the memory controller to determine a specific amount of data transmitted between the NAND-type flash memory and the dynamic random access memory unit.

Another objective of the present invention is to provide a method of performing a memory module for access of an external electronic device, and the memory module comprises a dynamic random access memory, a NAND-type flash memory, and a memory controller. The method comprises the following steps of: actively switching an internal power source to the dynamic random access memory and thereby retaining data stored in the dynamic random access memory unit when the memory module is electrically disconnected with an external power source of the external electronic device, wherein the dynamic random access memory is used as a non-volatile memory and the dynamic random access memory is used as a volatile memory when the internal power source is electrically disconnected with the dynamic random access memory.

The dynamic random access memory unit of the memory module according to the present invention has the internal power source for powering the dynamic random access memory when the memory module is disconnected with the external electronic device. Accordingly, data stored in the dynamic random access memory can be retained. Furthermore, when the external electronic device writes data in the NAND-type flash memory of the memory module, the memory controller controls the data to be accumulated to reach a pre-determined size in the dynamic random access memory first and then writes the accumulated data with pre-determined size in the NAND-type flash memory. This reduces erasing times and writing times of the NAND-type flash memory and extends lifetime of the NAND-type flash memory.

DESCRIPTION OF THE INVENTION

Figure 1:
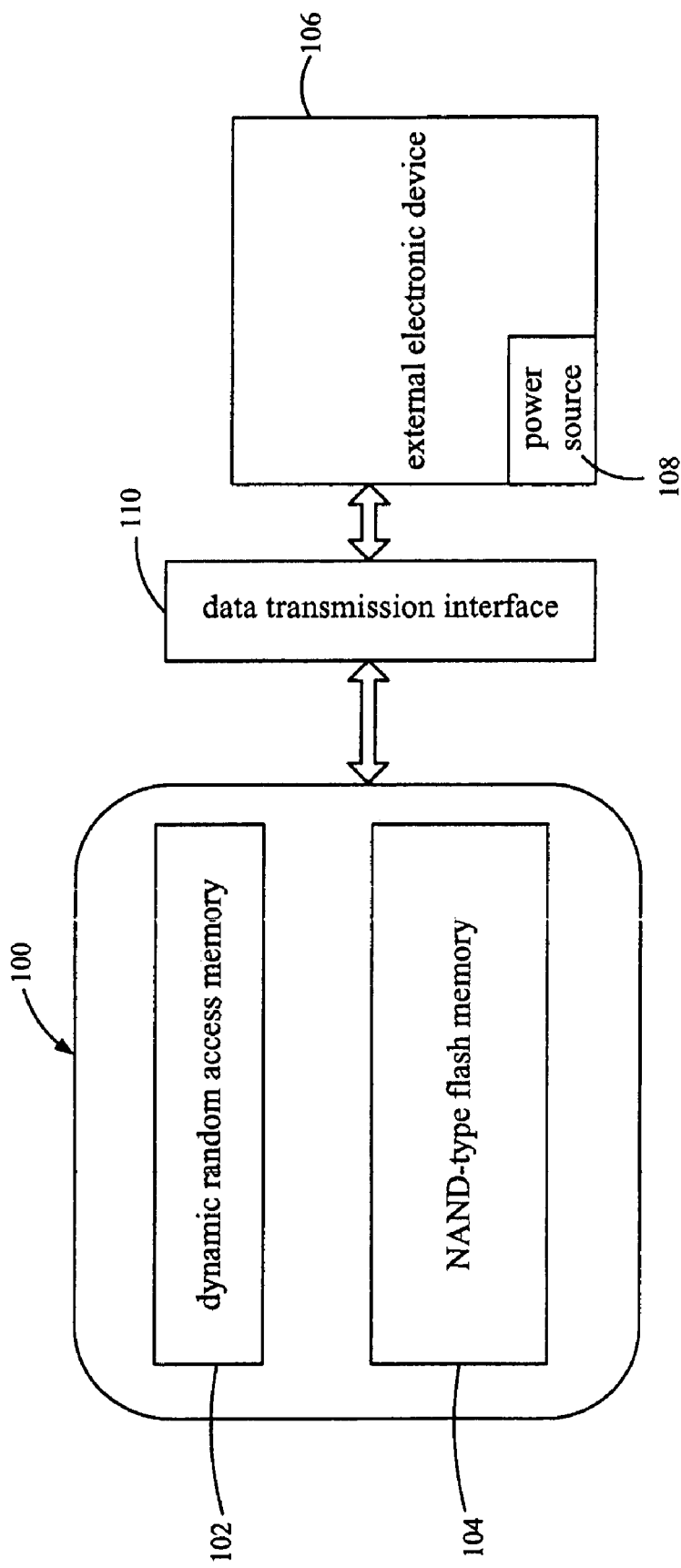
FIG. 1 shows a conventional memory module which utilizes a dynamic random access memory to be as a data cache of a NAND-type flash memory.
Figure 2:
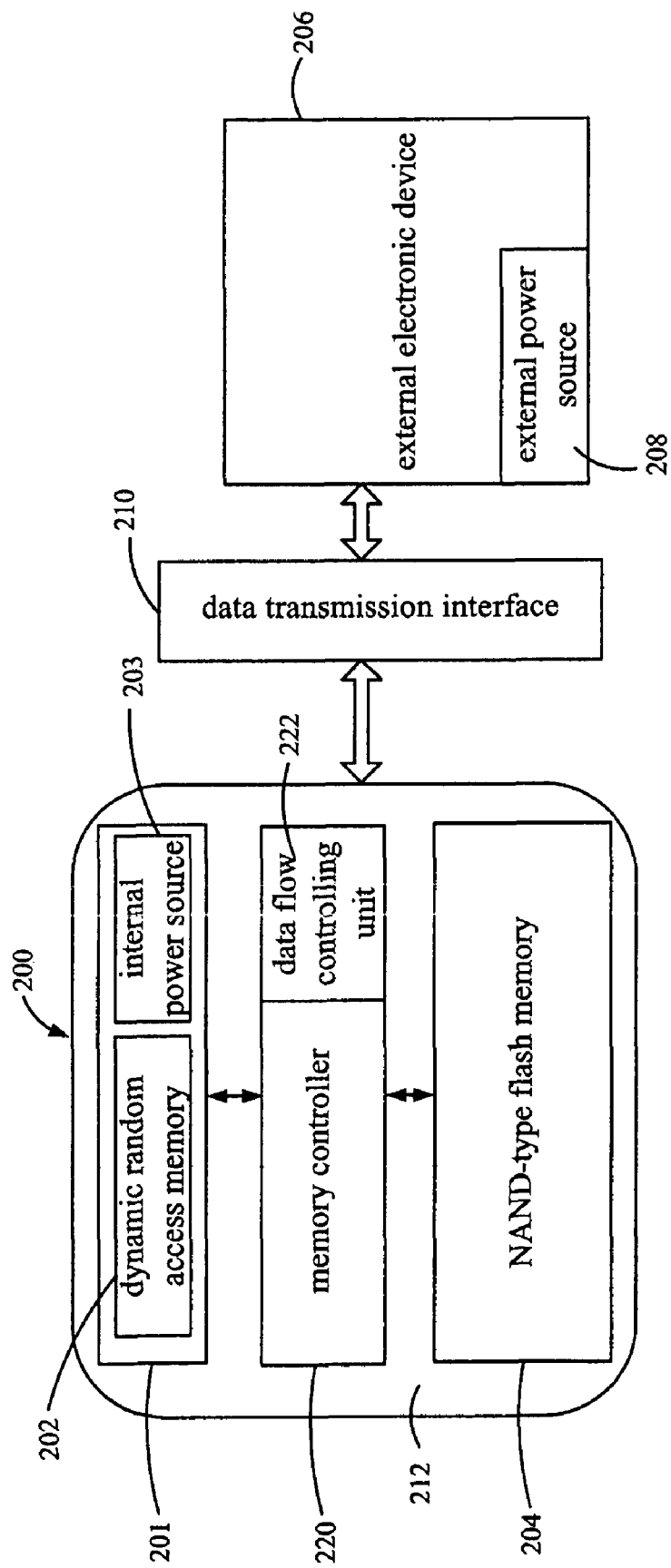
FIG. 2 illustrates a memory module according to one preferred embodiment of the present invention.

Please refer to FIG. 2, which illustrates a memory module 200 according to one preferred embodiment of the present invention. The memory module 200 is used for access of an external electronic device 206 such as a computer, a mobile phone, a personal digital assistant (PDA) and so on. The memory module 200 comprises a substrate 212, a data transmission interface 210, a NAND-type flash memory 204, a dynamic random access memory unit 201 and a memory controller 220. In this embodiment, the NAND-type flash memory 204, the dynamic random access memory unit 201 and the memory controller 220 are disposed on the substrate 212.

The memory module 200 is connected to the external electronic device 206 via the data transmission interface 210. The data transmission interface 210 does not only function as an interface translating the data transmitted between the dynamic random access memory unit 201 and the external electronic device 206 but also connects an external power source 208 in the external electronic device 206 to the dynamic random access memory unit 201 for external power supply.

The dynamic random access memory unit 201 is electrically connected to the NAND-type flash memory 204 and has a dynamic random access memory 202 and an internal power source 203 electrically connected to the dynamic random access memory 202. When the memory module 200 is disconnected with the external electronic device 206, for example that the memory module 200 is removed from the external electronic device 206, the internal power source 203 can be actively switched to power the dynamic random access memory, and thus data stored in the dynamic random access memory 202 is retained. In the preferred embodiment, the internal power source 203 may be a battery. For example, when the memory module 200 is electrically connected to the external electronic device 206, the battery can be charged by the external power source 208 of the external electronic device 206.

The memory controller 220 is used for controlling at least one of both the NAND-type flash memory 204 and the dynamic random access memory unit 201, and it mainly comprises a data flow controlling unit 222. The data flow controlling unit 222 determines a specific amount of data transmitted between the NAND-type flash memory 204 and the dynamic random access memory unit 201 in accordance with whether the data temporarily-stored in the dynamic random access memory 202 is accumulated to reach a pre-determined size (detailed later). The data flow controlling unit 222 may be implemented in a hardware or software, for example, when the external electronic device 206 has to write data in the NAND-type flash memory 204 of the memory module 200 via the data transmission interface 210, the data flow controlling unit 222 of the memory controller 220 controls the data written from the external electronic device 206 to be temporarily-stored in the dynamic random access memory 202, firstly. Then, the data flow controlling unit 222 determines whether the data temporarily-stored in the dynamic random access memory 202 is accumulated to reach the pre-determined size or not. After the data temporarily-stored in the dynamic random access memory 202 is accumulated to reach the pre-determined size such as a one-page size of the NAND-type flash memory 204, the accumulated data with the pre-determined size from the dynamic random access memory 202 is further written in or removed to the NAND-type flash memory 204 at a time. Therefore, the data transmitted between the NAND-type flash memory 204 and the dynamic random access memory unit 201 can be controlled with a specific amount of size. As a result, there is no need to write in the NAND-type flash memory 204 at each time when only little data appears. In an exemplar, if a one-page size of the NAND-type flash memory 204 is 4096 bytes (4 kilobytes), before the amount of the data written from the external electronic device 206 to the NAND-type flash memory reaches the pre-determined size of 4096 bytes, the written data are temporarily-stored in the dynamic random access memory 202 until its data amount is accumulated to reach the pre-determined size of 4096 bytes. Then, the temporarily-stored data with the pre-determined size of 4096 bytes is written in or moved from the dynamic random access memory 202 to the NAND-type flash memory 204 at a time. That is, the dynamic random access memory 202 is used as a data cache and a data buffer of the NAND-type flash memory 204.

Figure 3:
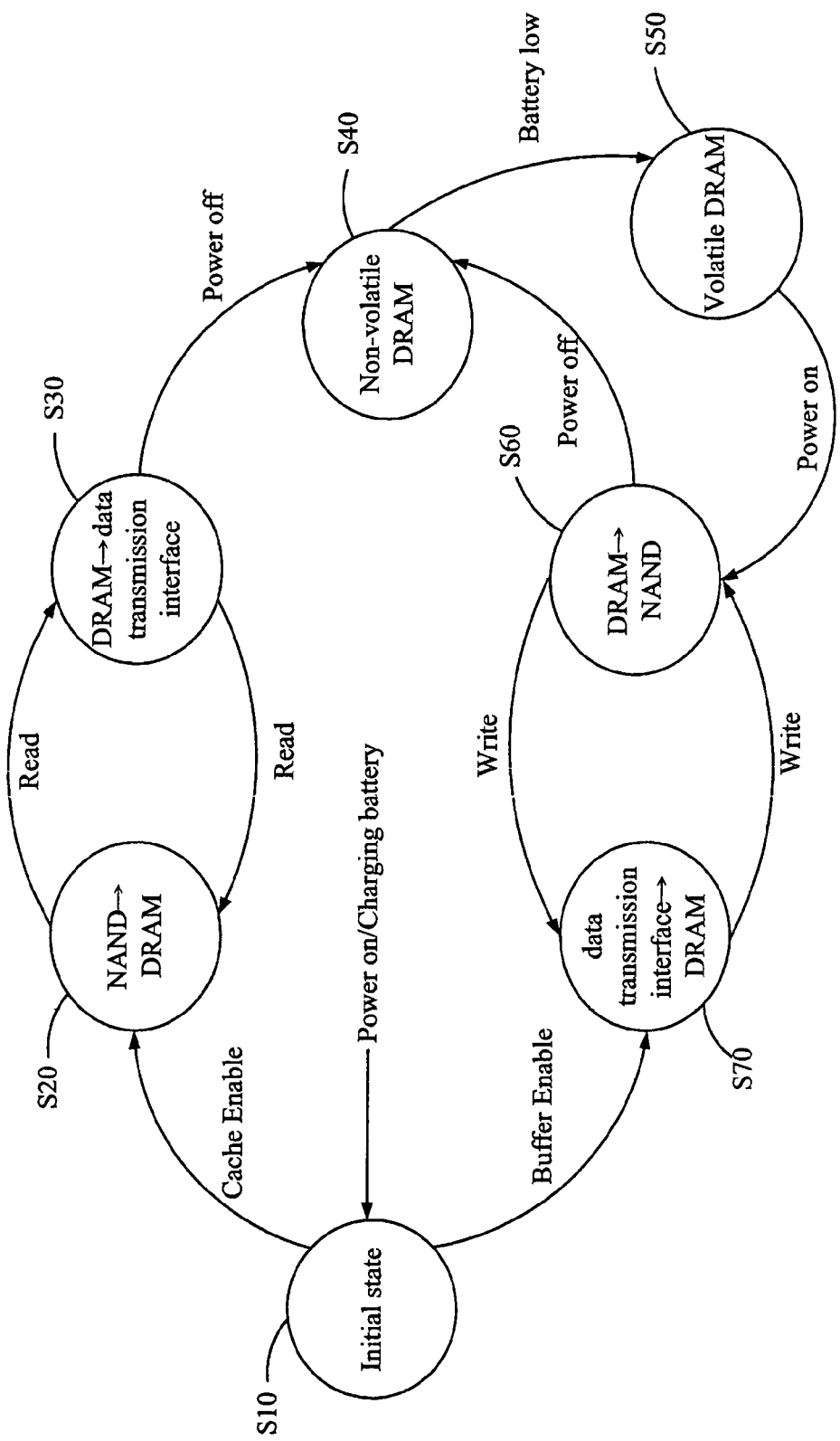
FIG. 3 illustrates a flow chart showing a method of performing a memory module according to one embodiment of the present invention.

FIG. 3 illustrates a flow chart showing a method of performing a memory module according to one embodiment of the present invention. State S10 is an initial state when an external electronic device is electrically connected to the memory module. The external electronic device provides a dynamic random access memory of the memory module with an external power source. At the same time, a battery of the memory module can be therefore charged by the external power source if necessary. In state S20, when the external electronic device has to read data from a NAND-type flash memory of the memory module, the data in the NAND-type flash memory is transmitted to the dynamic random access memory of the memory module. In state S30, the data stored in the dynamic random access memory is transmitted to the external electronic device via a data transmission interface. If an amount of the data is large, the data processing will circulates between states S20 and S30 until the data requested is transmitted from the NAND-type flash memory to the external electronic device via the dynamic random access memory and the data transmission interface. Accordingly, the dynamic random access memory is used as a data cache. In state S40, when the external electronic device is powered off, an internal power source (e.g. the battery) is actively switched to power the dynamic random access memory. That is, the dynamic random access memory is used as a non-volatile memory. On the contrary, as long as the battery is low, the dynamic random access memory is used as a volatile memory.

In another situation, when the external electronic device has to write data in the NAND-type flash memory, a data flow controlling unit of the memory controller controls the data to be temporarily-stored in the dynamic random access memory firstly and then writes the data in the NAND-type flash memory. If the amount of the data is large, the data processing circulates between states S70 and S60. The external electronic device transmits the data to the dynamic random access memory via the data transmission interface in state S70, and the data flow controlling unit of the memory controller controls the amount of the data to be accumulated to reach a pre-determined size such as a one-page of the NAND-type flash memory and then writes in the NAND-type flash memory at a time in state S60. It is noted that writing data to the NAND-type flash memory from state S10 is the same as the above-mentioned. It means that circulation between the states S70 and S60 will go on until the external electronic device finishes the step of writing the data in the NAND-type flash memory. Therefore, the dynamic random access memory is used as a data buffer of the NAND-type flash memory, too.

The dynamic random access memory unit of the memory module according to the present invention has the internal power source for actively powering the dynamic random access memory when the memory module is disconnected with the external electronic device, and therefore the data stored in the dynamic random access memory can be retained. Furthermore, when the external electronic device writes data in the NAND-type flash memory of the memory module, the memory controller controls the data to be accumulated to reach a pre-determined size in the dynamic random access memory firstly and then writes the accumulated data with the pre-determined size in the NAND-type flash memory at once. This reduces erasing times and writing times of the NAND-type flash memory and extends lifetime of the NAND-type flash memory.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A memory module for access of an external electronic device, comprising:
   a NAND-type flash memory;
   a dynamic random access memory unit electrically connected to the NAND-type flash memory, having a dynamic random access memory and an internal power source electrically connected to the dynamic random access memory; and
   a memory controller for controlling at least one of both the NAND-type flash memory and the dynamic random access memory unit, wherein when the memory module is electrically disconnected with the external electronic device, the internal power source is actively switched to power the dynamic random access memory and thereby retains data being stored in the dynamic random access memory.

2. The memory module of claim 1, wherein the internal power source is a battery which can be charged by the external electronic device, when the memory module is electrically connected to the external electronic device.

3. The memory module of claim 1, further comprising a data transmission interface established between the dynamic random access memory unit and the external electronic device for data transmitting.

4. The memory module of claim 1, wherein the memory controller controls written data from the external electronic device to be temporarily stored in the dynamic random access memory, and then the written data is written in the NAND-type flash memory when an amount of the written data is accumulated to reach a pre-determined size in the dynamic random access memory.

5. The memory module of claim 4, wherein the pre-determined size corresponds to a one-page size of the NAND-type flash memory.

6. The memory module of claim 1, wherein the dynamic random access memory is used as a data cache of the NAND-type flash memory.

7. The memory module of claim 1, wherein the external electronic device provides the dynamic random access memory with an external power source when the memory module is electrically connected to the external electronic device.

8. A method of performing a memory module for access of an external electronic device, the memory module comprising a dynamic random access memory, a NAND-type flash memory, and a memory controller, the method comprising steps of:

actively supplying an internal power source to connect the dynamic random access memory thereby retaining data being stored in the dynamic random access memory so that the dynamic random access memory is used as a non-volatile memory when the memory module is electrically disconnected with an external power source of the external electronic device; and using the dynamic random access memory as a volatile memory when the internal power source is electrically disconnected with the dynamic random access memory.

9. The method of claim 8, wherein the internal power source is a battery.

10. The method of claim 9, when the memory module is electrically connected to the external electronic device, the battery is charged by the external power source of the external electronic device.

11. The memory module of claim 1, wherein the dynamic random access memory unit buffering a data which is transmitted between the external electronic device and the memory module, the memory controller determines a specific amount of data being transmitted between the NAND-type flash memory and the dynamic random access memory unit according to size of the data buffered in the dynamic random access memory unit.

12. The memory module of claim 11, wherein the memory controller includes a data flow controlling unit for temporarily storing the data written from the external electronic device to the dynamic random access memory unit, and determining whether the amount of the written data is accumulated to reach a pre-determined size in the dynamic random access memory unit for being written in the NAND-type flash memory.

13. The memory module of claim 12, wherein the data flow controlling unit of the memory controller is implemented as a hardware or software.

14. The method of claim 8, further comprising the step of:

using the dynamic random access memory unit as a data cache and a data buffer for access between the external electronic device and the NAND-type flash memory; and determining a specific amount of data transmitted between the NAND-type flash memory and the dynamic random access memory unit according to an amount of data stored temporarily in the dynamic random access memory unit.

15. The method of claim 14, further comprising the step of:

temporarily storing the data written from the external electronic device to the dynamic random access memory unit; and writing the temporary-stored data in the NAND-type flash memory when the amount of the temporary-stored data is accumulated to reach a pre-determined size.

* * * * *